United States Patent
Sato et al.

(10) Patent No.: US 7,405,948 B2
(45) Date of Patent: Jul. 29, 2008

(54) CIRCUIT BOARD DEVICE AND METHOD OF INTERCONNECTING WIRING BOARDS

(75) Inventors: Junya Sato, Tokyo (JP); Yoshiyuki Hashimoto, Tokyo (JP); Masakazu Koizumi, Aichi (JP)

(73) Assignee: NEC Corporation, Tokyo (JP)

( * ) Notice: Subject to any disclaimer, the term of this patent is extended or adjusted under 35 U.S.C. 154(b) by 20 days.

(21) Appl. No.: 10/543,253

(22) PCT Filed: Jan. 22, 2004

(86) PCT No.: PCT/JP2004/000546

§ 371 (c)(1),
(2), (4) Date: Jul. 19, 2006

(87) PCT Pub. No.: WO2004/066691

PCT Pub. Date: Aug. 5, 2004

(65) Prior Publication Data

US 2006/0273446 A1 Dec. 7, 2006

(30) Foreign Application Priority Data

Jan. 22, 2003 (JP) ............................. 2003-012992

(51) Int. Cl.
*H05K 1/11* (2006.01)
(52) U.S. Cl. .................. 361/792; 361/752; 361/758
(58) Field of Classification Search .................. 29/830; 439/66; 174/261; 361/792, 752, 718
See application file for complete search history.

(56) References Cited

U.S. PATENT DOCUMENTS

| | | | | |
|---|---|---|---|---|
| 5,727,310 A * | 3/1998 | Casson et al. | ................. | 29/830 |
| 6,044,102 A * | 3/2000 | Labeyrie | ..................... | 372/96 |
| 6,215,667 B1 * | 4/2001 | Ady et al. | .................... | 361/752 |
| 6,296,493 B1 * | 10/2001 | Michiya | ...................... | 439/66 |
| 6,670,559 B2 * | 12/2003 | Centola et al. | ............. | 174/261 |
| 6,756,671 B2 * | 6/2004 | Lee et al. | .................... | 257/737 |

(Continued)

FOREIGN PATENT DOCUMENTS

JP 61-151979 7/1986

(Continued)

OTHER PUBLICATIONS

International Search Report dated Apr. 13, 2004.

*Primary Examiner*—Tuan Dinh
*Assistant Examiner*—Andargie M Aychillhum
(74) *Attorney, Agent, or Firm*—Dickstein Shapiro LLP

(57) ABSTRACT

A circuit board device comprises a first wiring board (79) having plural first electrode terminals (73, 75, 77) for connection row-arranged on a surface layer, a second wiring board (87) having plural second electrode terminals (81, 83, 85) for connection row-arranged on a surface layer, and an anisotropic conductive member (89) disposed therebetween to the electrode terminals (73, 75, 77, 81, 83, 85). A local portion of each of the wiring boards (79, 87) has a step difference to divide and dispose the electrode terminals (73, 75, 77, 81, 83, 85). A local portion of the anisotropic conductive member (89) corresponding to the step difference has a step shape that is capable of contacting with the step difference. A laminate comprising respective wiring boards (79, 87) and the anisotropic conductive member disposed therebetween is pressed and held in a lamination direction.

18 Claims, 10 Drawing Sheets

U.S. PATENT DOCUMENTS 7,170,748 B2 * 1/2007 Hein .......................... 361/718
2001/0012706 A1 8/2001 Imaeda

FOREIGN PATENT DOCUMENTS

| JP | 2-74784 | 6/1990 |
| JP | 11-121524 | 4/1999 |
| JP | 2001-230511 | 8/2001 |
| JP | 2002-56907 | 2/2002 |

* cited by examiner

CIRCUIT BOARD DEVICE AND METHOD OF INTERCONNECTING WIRING BOARDS

TECHNICAL FIELD

The present invention relates to a circuit board device including wiring boards connected and held each other on which printed wirings are formed such as a flexible printed wiring board and a rigid printed wiring board mounted on electronics mainly used in electrical and communication fields, and a method of interconnecting the wiring boards.

BACKGROUND ART

Conventionally, mobile phones, PDA (Personal Digital Assistant) terminals or other electronic devices include plural wiring boards on which printed wirings are formed and a number of electronic parts are mounted. The wiring boards are generally connected each other via a connector or using a connecting medium such as solder.

In recent years, the electronic devices have high-functionality and multifunctions. Plural printed wiring boards including a number of electrode terminals for connection should be connected. The electrode terminals are often disposed in a matrix array in the printed wiring board (the matrix array herein means that the electrode terminals are systematically, not always orthogonal, arranged in a matrix).

In the conventional electronic device, an example of the circuit board device including plural wiring boards connecting each other has a configuration that electrode (signal) terminals arranged in the matrix array on respective wiring boards can be connected. The circuit board device is a most general-purpose type such that two printed wiring boards are connected via a connector. Specifically, a convex (male) connector is attached as a connecting part at the predetermined portion of one printed wiring board, and a concave (female) connector is attached as a mating connecting part at the predetermined portion of the other printed wiring board. The electrode terminals on the respective printed wiring boards are electrically connected each other by fitting the connectors.

Japanese Unexamined Patent Application Publication No. 2002-56907 (FIG. 3, page 4, hereinafter referred to as Reference No. 1) discloses a circuit board device including plural wiring boards in the conventional electronic device that electrode (signal) terminals arranged in a matrix array on the wiring boards can be connected. The circuit board device comprises a first wiring board having plural first electrode terminals 33 for connection row-arranged on a surface layer, a second wiring board having plural second electrode terminals for connection row-arranged on a surface layer, and a square pole-shaped anisotropic conductive member disposed between the first wiring board and the second wiring board into which metal terminals are embedded corresponding to the positions of the electrode terminals. Specifically, vias are formed on the first electrode terminals of the first wiring board to draw wiring patterns onto an inner layer, vias are also formed on the second electrode terminals of the second wiring board to draw wiring patterns onto an inner layer, and the anisotropic conductive member is disposed between the first wiring board and the second wiring board to provide the laminated circuit board device. The electrode terminals of respective wiring boards are electrically connected each other via the metal terminals embedded into the anisotropic conductive member.

In this regard, in any of the conventional circuit board devices described above, the wiring boards are easily separated each other, whereby the wiring board can be replaced if an electronic part to be mounted is defective.

Similarly, it is known that electrode (signal) terminals arranged on a wiring board can be connected in a circuit board device including plural wiring boards in the conventional electronic device. The circuit board device is a general-purpose type that a flexible print wiring board having a connect portion is directly connected to a rigid print wiring board via a connecting means. Specifically, the electrode terminals of the flexible printed wiring board and the rigid printed wiring board are connected using a connecting medium such as solder, ACF (Anisotropic Conductive Film), ACP (Anisotropic Conductive Paste) and the like to provide the circuit board device. Thus, the electrode terminals of the flexible printed wiring board and the rigid printed wiring board are electrically connected via the connecting medium. When the solder is used as the connecting medium, typical solder generally used for mounting the electronic parts to the wiring board can be used. Before the wiring boards are connected, a solder paste may be applied to the electrode terminals of the wiring board to fix the boards temporarily, and the connected parts may be heated and pressed to connect and fix the wiring boards. When the ACF or the ACP is used upon the connection of the wiring boards, a film or a paste may be sandwiched between the electrode terminals to be connected, and heated and pressed to connect and fix the wiring boards as in the case of using the solder, since the ACF is a film-like form comprising an adhesive resin and fine conductive particles and the ACP is a paste-like form comprising the similar materials.

In regard to the applicability of the connecting medium, the solder is advantageously used with low costs because the solder is generally used for mounting other electronic parts. However, the solder liquefies upon the connection to shorten adjacent electrode terminals (conductive patterns) and is therefore not suitable for connecting the terminals with a narrow pitch (in fact, connecting the terminals having 0.3 mm pitch or less is technically difficult). Although the ACF or the ACP invites high costs as compared with the solder, the narrow pitch (even 0.05 mm pitch) can be realized and the ACF or the ACP is therefore generally used for connecting a glass substrate of a crystal liquid display and a crystal liquid driver.

Japanese Unexamined Utility Model Registration Application Publication No. 2-74784 (FIG. 1, claim of utility model, hereinafter referred to as Reference No. 2) discloses a circuit board device including plural wiring boards in the conventional electronic device that electrode (signal) terminals arranged in a matrix array on the wiring boards can be connected. A connector is inserted and mounted into/to a printed board having a guide to fit and contact the connector into/with contact pads having conductive patterns to provide a circuit board device. Specifically, a local portion at one side of the printed board is stepped as a pad plate. Plural contact pads (electrode terminals) are arranged on the pad plate. The guide having concave portions for catching near the local portion at one side of the printed board. One end of the connector having a thickness that is substantially same as that of the printed board has a step-like shape so that a contact plate can be engaged with the pad plate. Plural contacts are disposed under the contact plate such that the contacts are protruded in the same arrangement as the contact pads. Convex portions (spheres are attached to a panel) that apply a force to be caught by the concave portions of the guide are formed. One end of the guide of the printed board is inserted into one end of the connector. The guide is engaged and flushed with the connector in a state that the convex portions of the connector are caught by the concave portions of the guide. Thus, a circuit board device is provided. The contacts are slid and contacted with the contact pads to electrically connect the electrode terminals of the printed board and the connector.

The electrode terminals arranged on the wiring boards of the above-mentioned circuit board devices are evaluated for connection. All circuit board devices described above have the following problems.

The configuration using the solder, ACF, ACP and the like as the connecting medium as described above advantageously realizes a compact body accompanied by slimming and space-saving of the recent electronic devices. In this configuration, the wiring board cannot be easily removed. Therefore, once a defective part is found, all wiring boards including the wiring board to which the defective part is connected cannot be usable (this is noticeable especially when the solder is used), since a probability that a defective part is mounted on a latest-type LSI cannot be ignored (the probability that the defective part is found corresponds to the number of the parts, and the more the parts are, the more the probability increases). As a result, the manufacturing costs undesirably become high due to the defective part.

In contrast, in the configuration using the connector described earlier or using the anisotropic conductive member described in Reference No. 1, each wiring board can be removed. Accordingly, if the defective part is mounted, only the wiring board to which the defective part is connected is removed and replaced with a new one. The problem of an increase in the manufacturing costs caused by the defective part can be advantageously solved or reduced. However, in this configuration, a mounting height becomes high and therefore the compact body cannot be sufficiently realized.

In order to decrease a mounted area of the connection in such a configuration, a configuration of a CSP type substrate and a substrate connector is under review. The electrode terminals of the wiring board to which the connector is mounted are arranged in a matrix array, thereby reducing the mounted area. When respective electrode terminals are arranged in a matrix array for densification, vias are formed on the electrode terminals and the wirings should be drawn into the inner layer. When the vias are formed on the electrode terminals, the surfaces of the electrodes are dented about 15 to 40 µm. Accordingly, mounting the rigid CSP type connector may cause voids and a poor contact at the vias or stress concentration thereby decreasing reliability.

These problems also arise on the circuit board device using the anisotropic conductive material described in Reference No. 1. When the electrode terminals are arranged in a matrix array for densification, the wirings should be drawn into the inner layer. The vias dent the surfaces of the electrodes about 15 to 40 µm. Accordingly, a poor contact is provided at the vias.

Furthermore, in the circuit board device described in Reference No. 2, a contact pressure is produced only by a metal elasticity on a contact formed on a contact plate of the connector that fits into the stepped wiring board. In this case, the contact pressure may be changed depending on a height difference of the steps by the contact plate variations produced. When there are contact-to-contact variations upon the production, the contact pressure may be changed per contact even on the same step. Thus, the contact pads (electrode terminals) on the step are not electrically contacted with the contacts by the uniform contact pressure, resulting in poor connection.

In summary, solving the following problems is desirable: the circuit board device using the anisotropic conductive material described in Reference No 1 becomes high upon the mounting although the increase in the manufacturing costs caused by the defective part can be solved, the poor contact is produced at the vias, and the vias are difficult to be formed.

The present invention is made to solve these problems. An object of the present invention is to provide a circuit board device that can connect wiring boards on which plural electrode terminals for connection are arranged in a matrix array and can be removed and that is easily produced to realize further slimming and space-saving, and to provide a method of interconnecting wiring boards.

DISCLOSURE OF INVENTION

One aspect of the present invention provides a circuit board device, comprising: a first wiring board having plural first electrode terminals for connection row-arranged on a surface layer, a second wiring board having plural second electrode terminals for connection row-arranged on a surface layer, and an anisotropic conductive member disposed between the first wiring board and the second wiring board to connect the first electrode terminals and to connect the second electrode terminals. In the aspect of the present invention, a local portion of at least one of the first wiring board and the second wiring board has a step difference to divide and dispose at least one of the first electrode terminals and the second electrode terminals. A local portion of the anisotropic conductive member corresponding to the step difference has a step shape that is capable of contacting with the step difference. The first wiring board, the second wiring board and the anisotropic conductive member disposed therebetween constitutes a laminate pressed and held in a lamination direction, whereby the row-arranged first electrode terminals of the first wiring board are electrically connected via the anisotropic conductive member and the row-arranged second electrode terminals of the second wiring board are electrically connected via the anisotropic conductive member.

Another aspect of the present invention provides a method of interconnecting wiring boards electrically by disposing an anisotropic conductive member between a first wiring board having plural first electrode terminals for connection row-arranged on a surface layer and a second wiring board having plural of second electrode terminals for connection row-arranged on a surface layer, the anisotropic conductive member comprising an insulating portion having two surfaces faced each other, at least one conductive portion that is exposed on the two surfaces of the insulating portion through the two surfaces, and a step difference at at least one of the two surfaces.

The method comprises the steps of: forming the step difference to divide and dispose at least either of the first electrode terminals and the second electrode terminals at a local portion of at least one of the first wiring board and the second wiring board before the row-arranged first electrode terminals of the first wiring board and the row-arranged second electrode terminals of the second wiring board are connected; forming the local portion of the anisotropic conductive member corresponding to the position of the step difference so that the local portion can be contacted with the step difference; and pressing and fitting a laminate comprising the first wiring board, the second wiring board and the anisotropic conductive member disposed therebetween in a lamination direction so that the row-arranged first electrode terminals of the first wiring board are electrically connected via the anisotropic conductive member and the row-arranged second electrode terminals of the second wiring board are electrically connected via the anisotropic conductive member.

BEST MODE FOR CARRYING OUT THE INVENTION

Before describing embodiments of the present invention, a prior art wiring board device will be described referring to FIGS. 1 to 6 for easy understanding of the present invention.

Figure 1:
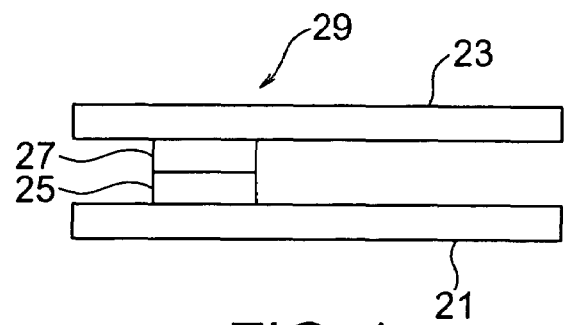
FIG. 1 is a side view of one example of a circuit board device having a configuration that plural of wiring boards are connected in a prior art electronic device that can connect electrode terminals arranged in a matrix array on respective wiring boards.

Referring to FIG. 1, one example of a circuit board device having a configuration that plural wiring boards are connected in a prior art electronic device can connect electrode (signal) terminals arranged in a matrix array on respective wiring boards. A most general-purpose circuit board device is shown where two print wiring boards 21 and 23 are connected via connectors 25 and 27, respectively. Specifically, the convex (male) connector 25 is attached as a connecting part at the predetermined portion of one printed wiring board 21, and the concave (female) connector 27 is attached as a mating connecting part at the predetermined portion of the other printed wiring board 23. The electrode terminals on the respective printed wiring boards 21 and 23 are electrically connected by fitting the connectors 25 and 27.

Figure 2:
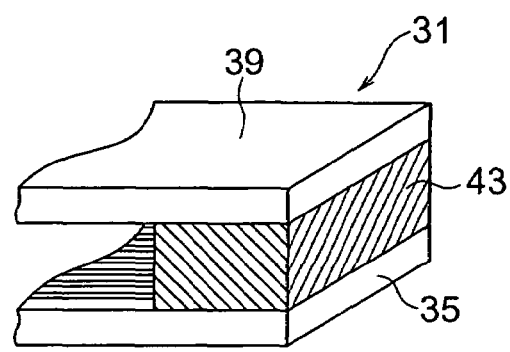
FIG. 2 is a main part perspective view of another example of a circuit board device having a configuration that plural of wiring boards are connected in a prior art electronic device that can connect electrode terminals arranged in a matrix array on respective wiring boards.
Figure 3:
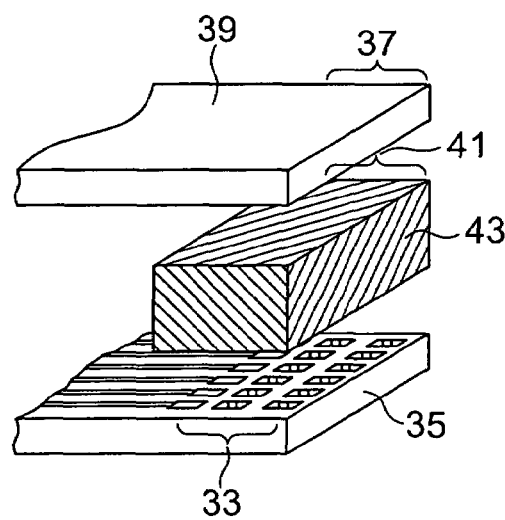
FIG. 3 is a main part perspective exploded view of the circuit wiring board shown in FIG. 2.
Figure 4:
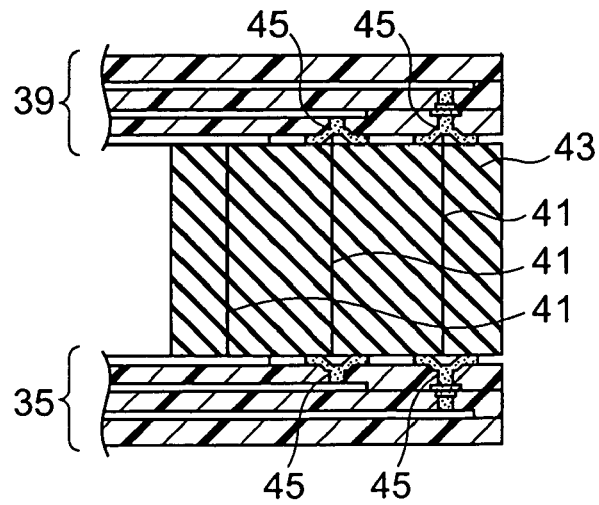
FIG. 4 is a side sectional view showing an enlarged main part detail of the circuit wiring board shown in FIG. 2.

Referring to FIGS. 2, 3 and 4, another circuit board device having a configuration that plural wiring boards are connected in a prior art electronic device as disclosed in Reference No. 2 can connect electrode (signal) terminals arranged in a matrix array on respective wiring boards. The circuit board device 31 comprises a first wiring board 35 having plural first electrode terminals 33 for connection row-arranged on a surface layer, a second wiring board 39 having plural second electrode terminals 37 for connection row-arranged on a surface layer, and a square pole-shaped anisotropic conductive member 43 disposed therebetween into which metal terminal groups 41 are embedded corresponding to the positions of the respective electrode terminals 33 and 37. Specifically, vias 45 are formed on the first electrode terminals 33 of the first wiring board 35 to draw wiring patterns onto an inner layer, vias 45 are also formed on the second electrode terminals 37 of the second wiring board 39 to draw wiring patterns onto an inner layer, and the anisotropic conductive member 43 is disposed between the first wiring board 35 and the second wiring board 39 to provide the laminated circuit board device. The electrode terminals of respective wiring boards 35 and 39 are electrically connected via the metal terminal groups 41 embedded into the anisotropic conductive member 43.

In this regard, in any of the circuit board devices shown in FIGS. 1 and 2, the wiring boards are easily separated each other, whereby the wiring board can be replaced if an electronic part to be mounted is defective.

Figure 5:
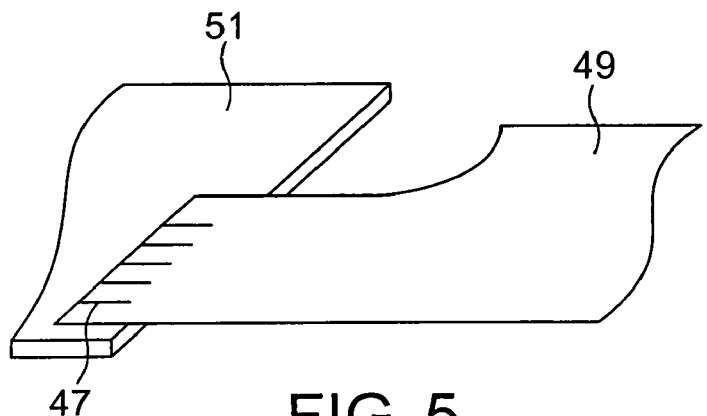
FIG. 5 is a perspective view showing another circuit board device having a configuration that plural of wiring boards are connected in a prior art electronic device that can connect electrode terminals arranged on respective wiring boards.

Referring to FIG. 5, another circuit board device having a configuration that plural wiring boards are connected in a prior art electronic device can connect electrode (signal) terminals arranged on respective wiring boards. There is shown a general-purpose circuit board device that a flexible printed wiring board 49 comprising a connector portion 47 is directly connected to a rigid printed wiring board 51 via a connecting medium. Specifically, the electrode terminals of the flexible printed wiring board 49 and the rigid printed wiring board 51 are connected each other using a connecting medium such as solder, ACF (Anisotropic Conductive Film), ACP (Anisotropic Conductive Paste) and the like to provide the circuit board device. Thus, the electrode terminals of the flexible printed wiring board 49 and the rigid printed wiring board 51 are electrically connected via the connecting medium.

When the solder is used as the connecting medium, typical solder generally used for mounting the electronic parts to the wiring board can be used. Before the wiring boards are connected, a solder paste may be applied to the electrode terminals of the wiring board to fix the boards temporarily, and the connected parts may be heated and pressed to connect and fix the wiring boards. When the ACF or the ACP is used upon the connection of the wiring boards, a film or a paste may be sandwiched between the electrode terminals to be connected, and heated and pressed to connect and fix the wiring boards as in the case of using the solder, since the ACF is a film-like form comprising an adhesive resin and fine conductive particles and the ACP is a paste-like form comprising the similar materials.

In regard to the applicability of the connecting medium, the solder is advantageously used with low costs because the solder is generally used for mounting other electronic parts. However, the solder liquefies upon the connection to shorten adjacent electrode terminals (conductive patterns) and is therefore not suitable for connecting the terminals with a narrow pitch (in fact, connecting the terminals having 0.3 mm pitch or less is technically difficult). Although the ACF or the ACP invites high costs as compared with the solder, the narrow pitch (even 0.05 mm pitch) can be realized and the ACF or the ACP is therefore generally used for connecting a glass substrate of a crystal liquid display and a crystal liquid driver.

Figure 6:
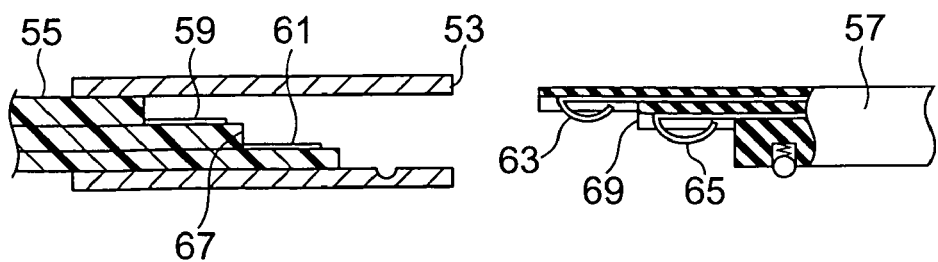
FIG. 6 is a main part enlarged side sectional view of still another example of a circuit board device having a configuration that plural of wiring boards are connected in a prior art electronic device that can connect electrode terminals arranged in a matrix array on respective wiring boards.

Referring to FIG. 6, still another circuit board device having a configuration that plural wiring boards are connected in a prior art electronic device as disclosed in Reference No. 2 can connect electrode (signal) terminals arranged in a matrix array on respective wiring boards. A connector 57 is inserted and mounted into/to a printed board 55 having a guide 53 to fit and contact contacts 63 and 65 of the connector 57 into/with contact pads 59 and 61 having conductive patterns of the print board 55 to provide a circuit board device. Specifically, a local portion at one side of the printed board 55 is stepped as a pad plate 67. Plural contact pads (electrode terminals) 59 and 61 are arranged on the pad plate 67. The guide 57 having concave portions for catching near the local portion at one side of the printed board 55. One end of the connector 57 having a thickness that is substantially same as that of the printed board 55 has a step-like shape so that a contact plate 69 can be engaged with the pad plate 67. Plural contacts 63 and 65 are disposed under the contact plate 69 such that contact portions of the plural contacts 63 and 65 are protruded in the same arrangement as the contact pads 59 and 61. Convex portions (spheres are attached to a spring) that apply a force to be caught by the concave portions of the guide 53 are formed. One end of the guide 53 of the printed board 55 is inserted into one end of the connector 57. The concave portions of the guide 53 are engaged and flushed with the convex portions of the connector 57 in a state that the convex portions of the connector 57 are caught by the concave portions of the guide 53. Thus, a circuit board device is provided. The contacts 63 and 65 are slid and contacted with the contact pads 59 and 61 to electrically connect the electrode terminals of the printed board and the connector.

The embodiment of the present invention will be described in detail with reference to FIGS. 7 to 23.

Figure 7:
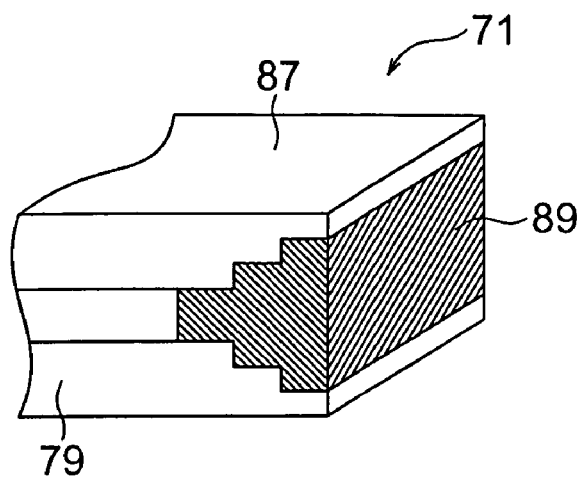
FIG. 7 is a main part perspective view of a circuit board device according to the inventive technical principle having a configuration that plural wiring boards are connected in a prior art electronic device that can connect electrode terminals arranged in a matrix array on respective wiring boards.
Figure 8:
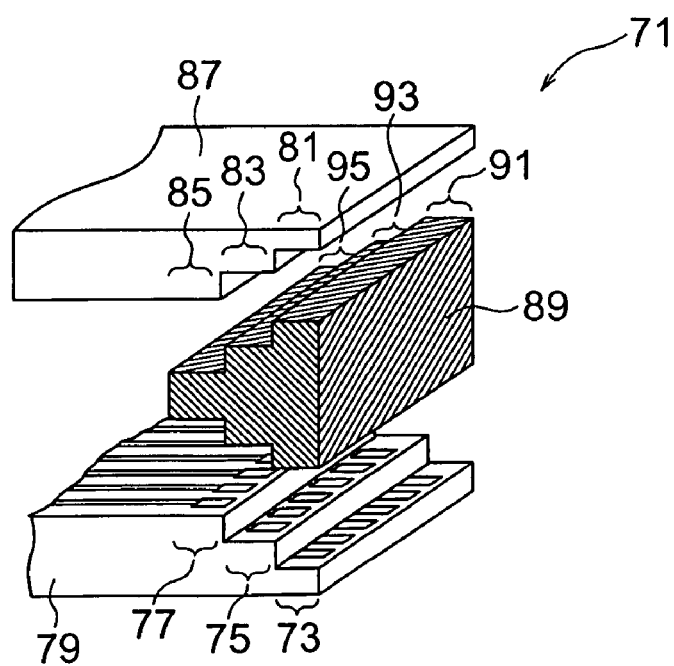
FIG. 8 is a main part perspective exploded view of the circuit wiring board shown in FIG. 7.
Figure 9:
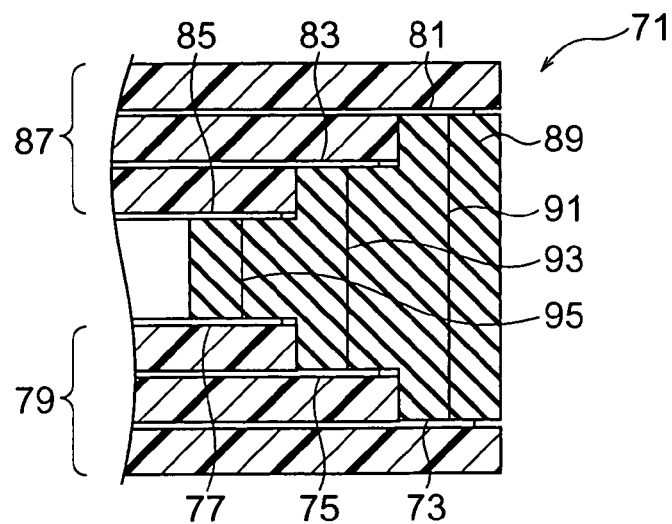
FIG. 9 is a side sectional view showing an enlarged main part detail of the circuit wiring board shown in FIG. 7.

Now referring to FIGS. 7, 8 and 9, a circuit board device 71 according to the inventive technical principle comprises a first wiring board 79 having plural first electrode terminals 73, 75 and 77 for connection row-arranged on a surface layer, a second wiring board 87 having plural second electrode terminals 81, 83 and 85 for connection row-arranged on a surface layer, and an anisotropic conductive member 89 disposed between the first and second wiring boards 79 and 87 to connect the first electrode terminals 73, 75 and 77 and to connect the second electrode terminals 81, 83 and 85, wherein local portions of the first and second wiring boards 79 and 87 have step differences to divide and dispose the first electrode terminals 73, 75 and 77 and the second electrode terminals 81, 83 and 85, wherein a local portion of the anisotropic conductive member 89 corresponding to the positions of the step differences has a step shape that is capable of contacting with the step differences, and a laminate comprising the first wiring board 79, the second wiring board 89 and the anisotropic conductive member 89 disposed therebetween is pressed and held in a lamination direction, whereby the row-arranged first electrode terminals 73, 75 and 77 of the first wiring board 79 are electrically connected via the anisotropic conductive member 89 and the row-arranged second electrode terminals 81, 83 and 85 of the second wiring board 87 are electrically connected via the anisotropic conductive member 89.

In other words, on the first wiring board 79, the step differences are formed between the row-arranged first electrode terminals 73, 75 and 77. Respective electrode terminals 73, 75 and 77 are disposed in a matrix array without forming vias on the step differences. Wiring surfaces are laminated on a surface layer so that respective electrode terminals 73, 75 and 77 are row-arranged and divided per step difference. The laminate comprises wiring patterns for drawing the wirings across plural different layers.

Also, on the second wiring board 87, the step differences are formed between the row-arranged second electrode terminals 81, 83 and 85. Respective electrode terminals 81, 83 and 85 are disposed in a matrix array without forming vias on the step differences. Wiring surfaces are laminated on a surface layer so that respective electrode terminals 81, 83 and 85 are row-arranged and divided per step difference. The laminate comprises wiring patterns for drawing the wirings across plural different layers.

The anisotropic conductive member 89 has step differences in both lamination (thickness) directions. The step differences correspond to the step differences formed by the first electrode terminals 73, 75 and 77 of the first wiring board 79 and the second electrode terminals 81, 83 and 85 of the second wiring board 87. The anisotropic conductive member 89 has a conductive portion and an insulating portion that are integrally formed. The conductive portion extends in the lamination direction between the first and second wiring boards 79 and 87, and has exposed ends. The insulating portion occupies a large portion excluding the both ends of the conductive portion. The metal terminal groups 91, 93 and 95 that are embedded as the conductive portion into the insulating portion extend in the lamination direction positionally corresponding to the first electrode terminals 73, 75 and 77 of the first wiring board 79 and the second electrode terminals 81, 83 and 85 of the second wiring board 87. The exposed both ends are connectable.

In other words, in the circuit board device, the first electrode terminals 73, 75 and 77 formed on the step differences of the first wiring board 79 are disposed facing and corresponding to the second electrode terminals 81, 83 and 85 formed on the step differences of the second wiring board 87.

The step differences disposed at the local portion of the anisotropic conductive member 89 are sandwiched between the first and second wiring boards 79 and 87 in the lamination direction. The step differences of the anisotropic conductive member 89 are formed tapered down from the centers of the first and second wiring boards 79 and 87 to the ends thereof so that the step differences of the anisotropic conductive member 89 and the step differences of the first and second wiring boards 79 and 87 are tightly contacted. The metal terminals 91, 93, and 95 separately formed on the step differences extend in the lamination direction, and are contacted with the first electrode terminals 73, 75 and 77 of the first wiring board 79 and the second electrode terminals 81, 83 and 85 of the second wiring board 87 at the exposed ends.

The first electrode terminals 73, 75 and 77 of the first wiring board 79, the second electrode terminals 81, 83 and 85 of the second wiring board 87 and the metal terminals 91, 93, and 95 of the anisotropic conductive member 89 disposed therebetween are pressed by a press member not shown in the lamination (above and below) direction, whereby they are contacted and electrically connected. The step differences of the anisotropic conductive member 89 are formed so that a difference in a repulsion stress generated stepwise by pressurizing can be absorbed.

When a fine metallic wire is used as the conductive material for the metal terminal groups 91, 93 and 95 embedded into the anisotropic conductive member 89, a cylindrical fine metallic wire made of gold, copper, brass, phosphor bronze, nickel or stainless steel, or a fine alloy wire containing them as a main component can be used. Other than the fine metallic wire, cylindrical particles each having a diameter of 5 to 100 μm can be used. Examples include metal particles, gold plated articles, silver plated particles, copper plated particles, carbon particles and metal plated rein particles. The insulating portion covering the metal terminals 91, 93 and 95 may be made of an insulating elastic resin material.

In this regard, a part or all of the cylindrical fine metallic wire may be gold plated to decrease a resistance value. A size (diameter) of the fine metallic wire may be within the range of 5 to 100 μm. If the diameter exceeds the range, the anisotropic conductive member 109 has great stiffness, which requires inconveniently greater press force. If the diameter is less than the range, the resistance value becomes too great to connect.

In the above-mentioned circuit board device, the wiring boards 79 and 87 and the anisotropic conductive member 89 may be pressed at the press force within the range of 0.05 to 1.2 N per each electrode terminal 73, 75, 77, 81, 83 or 85. The press force depends on the stiffness, the thickness and the type of the anisotropic conductive member 89, flatness of each electrode terminal 73, 75, 77, 81, 83 or 85, and the stiffness of the board. When an adhesive is applied to end faces of the anisotropic conductive member 89 that are contacted with respective electrode terminals 73, 75, 77, 81, 83 and 85, easy assembly can be realized, and misalignment by vibration can be prevented. Although examples of the wiring boards 79 and 87 include a flexible wiring board and a rigid print wiring board, any non-limiting boards can be used as the wiring boards 79 and 87. Preferably, one or more of a multilayer flexible circuit board, a multilayer rigid print circuit board, a double face flexible circuit board, and a double face rigid print circuit board, may be used. Moreover, as long as the electrode terminals 73, 75, 77, 81, 83 and 85 can be formed in pitches as plural lines without vias, step differences between the electrode terminals 73, 75, 77, 81, 83 and 85 can be removed. Any non-limiting number of the lines of the electrode terminals 73, 75, 77, 81, 83 and 85 on the wiring boards 79 and 87 can be used.

In the above-mentioned circuit board device, the step differences are formed on both local portions of the wiring boards 79 and 87, the electrode terminals 73, 75, 77, 81, 83 and 85 are divided and disposed thereon, and the step differences are formed on both sides of the anisotropic conductive member 89 in the lamination (thickness) direction. Alternatively, the step differences may be formed on either one local portion of the wiring boards 79 and 87, the electrode terminals 73, 75, 77, 81, 83 and 85 may be divided and disposed thereon, and the step differences may be formed on one side of the anisotropic conductive member 89 in the lamination (thickness) direction.

In either case, according to the method of connecting the electrode terminals on the wiring boards using the above-mentioned circuit board device, i.e., the method of interconnecting the wiring boards, the anisotropic conductive member 89 is disposed between the first wiring board 79 having the plural first electrode terminals 73, 75 and 77 for connection row-arranged on the surface layer and the second wiring board 87 having the plural second electrode terminals 81, 83 and 85 for connection row-arranged on the surface layer. Before the row-arranged first electrode terminals 73, 75 and 77 on the first wiring board 79 and the row-arranged second electrode terminals 81, 83 and 85 on the second wiring board 87 are connected, respectively, the step differences are formed at at least one local portion of the first and second wiring boards 79 and 87 to divided and dispose at least one side of the first electrode terminals 73, 75 and 77 and the second electrode terminals 81, 83 and 85. The step differences formed at the local portion of the anisotropic conductive portion 89 can be contacted with the corresponding step differences of the wiring boards. The laminate comprising the first wiring board 79, the second wiring board 89 and the anisotropic conductive member 89 disposed therebetween is pressed and held in the lamination direction, whereby the row-arranged first electrode terminals 73, 75 and 77 of the first wiring board 79 are electrically connected via the anisotropic conductive member 89 and the row-arranged second electrode terminals 81, 83 and 85 of the second wiring board 87 are electrically connected via the anisotropic conductive member 89. In this regard, in the method of interconnecting the wiring boards, the laminate may be pressed and held by mounting the press member having fitting force and elastic recovery force.

According to the circuit board device and the method of interconnecting the wiring boards of the present invention, various advantages are provided. The circuit board device comprising the removable wiring boards on which the plural electrode (signal) terminals for connection are disposed in a matrix array can be produced easier than the conventional configuration including the vias or the connectors, thereby realizing slimming and space-saving. It is also possible to prevent a poor contact caused by the dented vias upon the use of the anisotropic conductive member, and a poor electrical connection caused by warping of the board. In addition, since the electrode terminals of each wiring board are adhered using no connecting medium, each wiring board would not be damaged. Even if the defective part is produced, the wiring board can be removed easily.

Embodiments of the circuit board device and the method of interconnecting the wiring boards according to the present invention will be described in detail.

Figure 10:
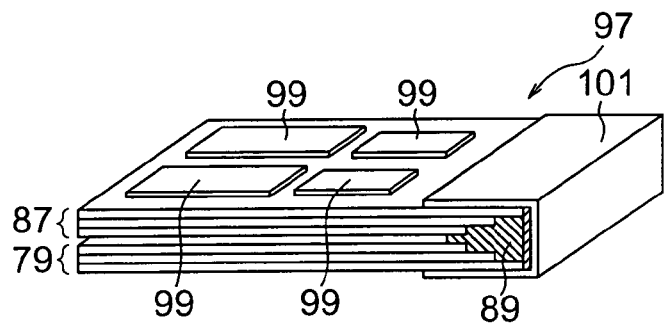
FIG. 10 is a whole perspective view showing a circuit board device according to a first embodiment of the present invention that can connect electrode terminals arranged in a matrix array on respective wiring boards.
Figure 11:
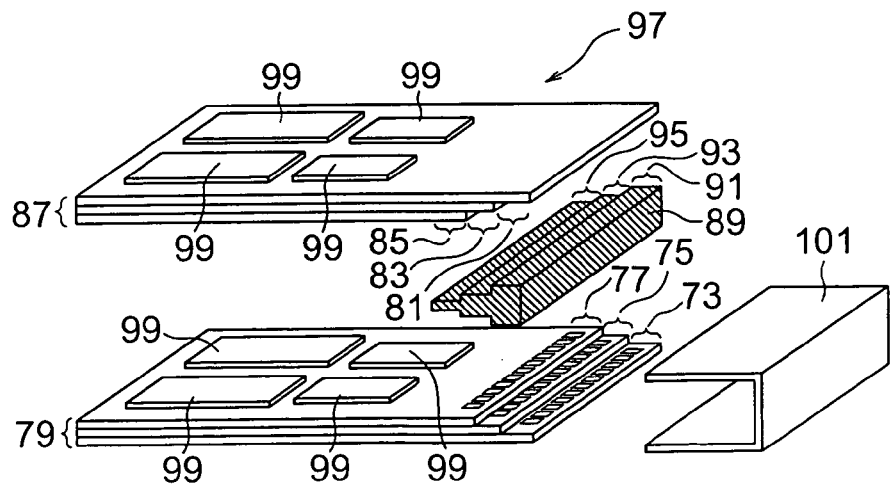
FIG. 11 is an exploded view of a whole circuit wiring board shown in FIG. 10.
Figure 12:
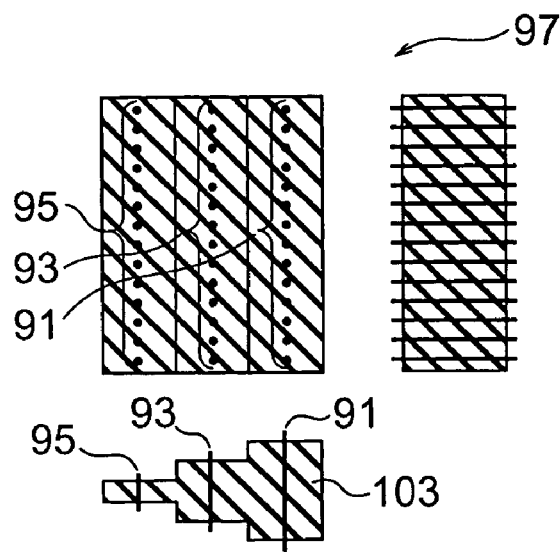
FIG. 12 is a three-view showing a detail of an anisotropic conductive member for use in the circuit board device shown in FIG. 10.

Referring to FIGS. 10, 11 and 12, the circuit board device according to the first embodiment of the present invention and the anisotropic conductive member 89 are substantially the same as described in the inventive technical principle referring to FIGS. 7, 8 and 9, except that LSIs (Large Scale Integrated circuits) 99 are mounted on predetermined four parts of the first wiring board 79 and on predetermined four parts of the second wiring board 87, and that one end of the laminate comprising the first wiring board 79, the second wiring board 87 and the anisotropic conductive member 89 disposed therebetween is pressed by a press member 101 having a substantially C-shaped section in one lateral direction. The press member 101 is a plate spring having elastic recovery force that can be mounted to the laminate. A housing having fitting force that can be mounted to the laminate may be used.

Figure 13:
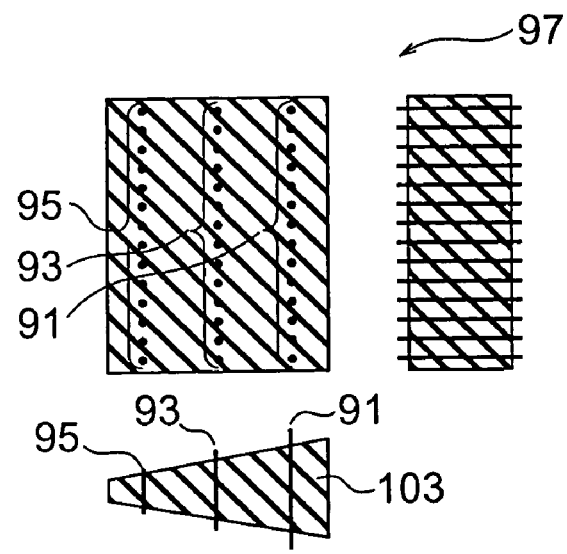
FIG. 13 is a three-view showing a detail of another anisotropic conductive member of the circuit board device shown in FIG. 10.

The anisotropic conductive member 89 shown in FIG. 13 is tapered down from the centers of the first and second wiring boards 79 and 87 to the ends thereof corresponding to the step differences of the first and second wiring boards 79 and 87 in the lamination (thickness) direction of the first and second wiring boards 79 and 87 so that the step differences are tightly contacted.

Figure 14:
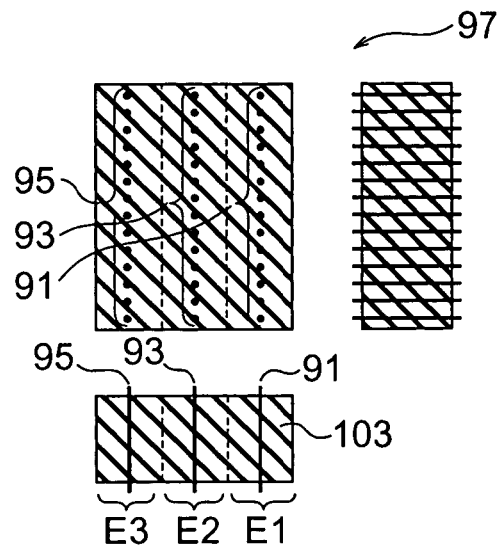
FIG. 14 is a three-view showing a detail of a variable anisotropic conductive member according to a first application of the circuit board device shown in FIG. 10.

The anisotropic conductive member 89 shown in FIG. 14 comprises an insulating elastic resin material whose hardness is changed from the ends to the centers of the first and second wiring boards 79 and 87. Along the direction, the hardness is sequentially decreased: the area E1 has a hardness of 50 degree, the area E2 has a hardness of 40 degree, the area E3 has a hardness of 30 degree.

Figure 15:
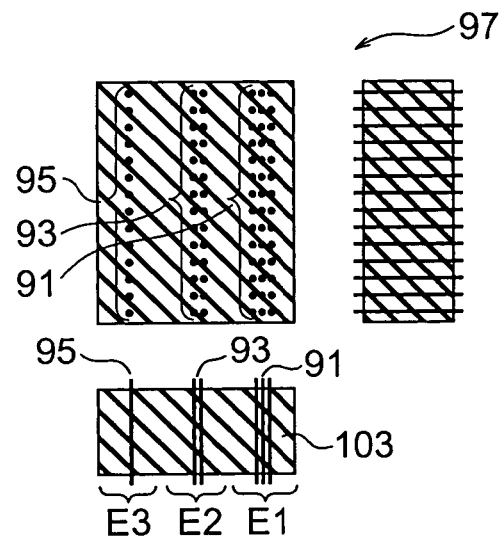
FIG. 15 is a three-view showing a detail of a variable anisotropic conductive member according to a second application of the circuit board device shown in FIG. 10.

The anisotropic conductive member 89 shown in FIG. 15 comprises a conductive material, i.e., metal terminal groups 91, 93 and 95 whose densities (numbers) per unit area are changed from the ends to the centers of the first and second wiring boards 79 and 87. Along the direction, the density is sequentially decreased: the metal terminal groups 91 at the area E1 have a density of $21/mm^2$, the metal terminal groups 93 at the area E2 have a density of $14/mm^2$, the metal terminal groups 95 have a density of $7/mm^2$.

The circuit board device is constituted by a multilayer rigid print wiring board so that the first and second wiring boards 79 and 87 each having four layers including a FR4 board (although three layers are shown in Figure, a wiring layer is further formed thereon).

As to the first wiring board 79, the first electrode terminals 73, 75 and 77 are disposed as steps by a build-up process. Three wiring circuits are formed on the divided electrode terminals 73, 75 and 77 without forming the vias. The first electrode terminals 73, 75 and 77 are disposed in a matrix array of 10 rows×3 columns. Wirings of the electrode terminals 73 and 75 are drawn to the same layer of the electrode terminal 77 through vias disposed on an area not shown other than the electrode terminals. Four LSIs 99 are surface-mounted on the same layer of the electrode terminal 77. Through the vias or the wiring circuits as described above, the first electrode terminals 73, 75 and 77 are electrically conducted. The first electrode terminals 73, 75 and 77 on the first wiring board 79 has 10 terminals, a pitch of 0.2 mm (L/S=0.1/0.1 mm), a terminal size of 0.1 (W)×0.3 (L) mm. The step difference between the terminals is 60 μm.

As to the second wiring board 87 similar to the first wiring board 79, the second electrode terminals 81, 83 and 85 are disposed as steps by the build-up process. Three wiring circuits are formed on the divided electrode terminals 81, 83 and 85 without forming the vias. The second electrode terminals 81, 83 and 85 are disposed in a matrix array of 10 rows×3 columns. Wirings of the electrode terminals 81, 83 and 85 are drawn to a back layer of the electrode terminal 81 through vias disposed on an area not shown other than the electrode terminals. Four LSIs 99 are surface-mounted on the back layer of the electrode terminal 81. Through the vias or the wiring circuits as described above, the second electrode terminals 81, 83 and 85 are electrically conducted. The second electrode terminals 81, 83 and 85 on the second wiring board 87 has 10 terminals, a pitch of 0.2 mm (L/S=0.1/0.1 mm), a terminal size of 0.1 (W)×0.3 (L) mm. The step difference between the terminals is 60 μm.

The first wiring board 79 on which the first electrode terminals 73, 75 and 77 are disposed per step difference and the second wiring board 87 on which the second electrode terminals 81, 83 and 85 are disposed per step difference are disposed such that the electrode terminals 73 and 81, the electrode terminals 75 and 83, and the electrode terminals 77 and 85 are faced each other. As shown in FIG. 12, the metal terminal groups 91, 93 and 95 are embedded into the anisotropic conductive member 89 so that both ends are exposed at the step differences corresponding to the first electrode terminals 73, 75 and 77 of the first wiring board 79 and the second electrode terminals 81, 83 and 85 of the second wiring board 87. The anisotropic conductive member 89 is sandwiched between the first wiring board 79 and the second wiring board 87, and is pressed and held by the press member 101 in the lamination (above and below) direction to be electrically connected, thereby providing the circuit board device shown in FIG. 10.

In the anisotropic conductive member 89, the insulating elastic resin material 103 was made of a silicone rubber having a rubber hardness of 50 degree (JIS-K-6249), and the metal conductive terminals 91, 93 and 95 were made of an Au-plated SUS line having a diameter of 12 μm. The thinnest part of the anisotropic conductive member 89 had a thickness of 0.3 mm. The step differences of 60 μm were formed at the sides corresponding to the step differences of the first and second wiring boards 79 and 87. The step difference corresponding to the electrode terminals 77 and 85 had a thickness of 0.3 mm, the step difference corresponding to the electrode terminals 75 and 83 had a thickness of 0.42 mm, and the step difference corresponding to the electrode terminals 73 and 81 had a thickness of 0.54 mm.

The press member 101 was a substantially C-shaped (or U-shaped) section plate spring having a thickness of 0.3 mm, and was made of SUS304CPS. The first and second wiring boards 79 and 87 and the anisotropic conductive member 89 were pressed at the press force of 0.6 N per each electrode terminal.

In addition, for positioning of respective parts in the circuit board device, alignment marks not shown attached to the first and second wiring boards 87 and 89 and the anisotropic conductive member 89 were observed by a CCD camera such that the anisotropic conductive member 89 and the second wiring board 87 were positioned to the first wiring board 79. The positioning accuracy was ±50 μm.

The circuit board device according to the present invention produced using the stepped anisotropic conductive member 89 and the comparative circuit board device produced using a general flat plate anisotropic conductive member were tested and evaluated by a four probe method. A DC contact electric resistance values were measured and averaged between the electrode terminals 73 and 81, the electrode terminals 75 and 85, and the electrode terminals 77 and 85, respectively. Between the electrode terminals 73 and 81, the resistance value was 0.44Ω in the inventive circuit, and was 15Ω in the comparative circuit. Between the electrode terminals 75 and 85, the resistance value was 0.43Ω in the inventive circuit, and was 1.8Ω in the comparative circuit. Between the electrode terminals 77 and 85, the resistance value was 0.35Ω in the inventive circuit, and was 0.35Ω in the comparative circuit.

The DC contact electric resistance values between the electrode terminals 73 and 81, 75 and 83, and 77 and 85 were within the range of 0.35 to 0.44Ω in the circuit board device using the stepped anisotropic conductive member 89 according to the present invention. The DC contact electric resistance values between the electrode terminals 73 and 81, 75 and 83, and 77 and 85 were within the range of 0.35 to 15Ω in the comparative circuit board device using the flat plate anisotropic conductive member. It was found that by using the stepped anisotropic conductive member 89 having step differences corresponding to the step differences of the electrode terminals 73, 81, 75, 83, 77 and 85, a difference in a repulsion stress generated stepwise by pressurizing could be absorbed and its practical utility was confirmed.

In this regard, the first electrode terminals 73, 75 and 77 and the second electrode terminals 81, 83 and 85 are disposed in a matrix array of 10 rows×3 columns in this embodiment. However, the number is not limited thereto, any matrix array of n rows×columns can provide the similar results.

Then, a tapered anisotropic conductive member 89 shown in FIG. 13 will be described. In the anisotropic conductive member 89, the insulating elastic resin material 103 was made of a silicone rubber having a rubber hardness of 50 degree (JIS-K-6249), and the metal conductive terminals 91, 93 and 95 were made of an Au-plated SUS line having a diameter of 12 μm. The thinnest part of the anisotropic conductive member 89 had a thickness of 0.3 mm. The taper was formed at the side that corresponds 60 μm of the step differences of the first and second wiring boards 79 and 87. The step difference corresponding to the electrode terminals 77 and 85 had a thickness of 0.3 mm, the step difference corresponding to the electrode terminals 75 and 83 had a thickness of 0.42 mm, and the step difference corresponding to the electrode terminals 73 and 81 had a thickness of 0.54 mm.

The press member 101 was a flat plate spring having a thickness of 0.3 mm, and was made of SUS304CPS. The first and second wiring boards 79 and 87 and the anisotropic conductive member 89 were pressed at the press force of 0.6 N per each electrode terminal.

In addition, for positioning of respective parts in the circuit board device, alignment marks not shown attached to the first and second wiring boards 87 and 89 and the anisotropic conductive member 89 were observed by a CCD camera such that the anisotropic conductive member 89 and the second wiring board 87 were positioned to the first wiring board 79. The positioning accuracy was ±50 μm.

The circuit board device according to the present invention produced using the tapered anisotropic conductive member 89 and the comparative circuit board device produced using a general flat plate anisotropic conductive member were tested and evaluated by a four probe method. A DC contact electric resistance values were measured and averaged between the electrode terminals 73 and 81, the electrode terminals 75 and 85, and the electrode terminals 77 and 85, respectively. Between the electrode terminals 73 and 81, the resistance value was 0.47Ω in the inventive circuit, and was 15Ω in the comparative circuit. Between the electrode terminals 75 and 85, the resistance value was 0.45Ω in the inventive circuit, and was 1.8Ω in the comparative circuit. Between the electrode terminals 77 and 85, the resistance value was 0.34Ω in the inventive circuit, and was 0.35Ω in the comparative circuit.

The DC contact electric resistance values between the electrode terminals 73 and 81, 75 and 83, and 77 and 85 were within the range of 0.34 to 0.47Ω in the circuit board device using the stepped anisotropic conductive member 89 according to the present invention. The DC contact electric resistance values between the electrode terminals 73 and 81, 75 and 83, and 77 and 85 were within the range of 0.35 to 15Ω in the comparative circuit board device using the flat plate anisotropic conductive member. It was found that by using the tapered anisotropic conductive member 89 having step differences corresponding to the step differences of the electrode terminals 73, 81, 75, 83, 77 and 85, a difference in a repulsion stress generated stepwise by pressurizing could be absorbed and its practical utility was confirmed.

In this regard, the first electrode terminals 73, 75 and 77 and the second electrode terminals 81, 83 and 85 are disposed in a matrix array of 10 rows×3 columns in this embodiment. However, the number is not limited thereto, any matrix array of n rows×m columns can provide the similar results.

Then, an anisotropic conductive member 89 comprising an insulating elastic resin material whose hardness is sequentially changed shown in FIG. 14 will be described. The anisotropic conductive member 89 is a flat plate having a thickness of 0.54 mm, the area E3 of the insulating elastic resin material 103 corresponding to the electrode terminals 77 and 85 has a rubber hardness of 30 degree (JIS-K-6249), the area E2 of the insulating elastic resin material 103 corresponding to the electrode terminals 75 and 83 has a rubber hardness of 40 degree (JIS-K-6249), and the area E1 of the insulating elastic resin material 103 corresponding to the electrode terminals 73 and 81 has a rubber hardness of 50 degree (JIS-K-6249). The metal conductive terminals 91, 93 and 95 were made of an Au-plated SUS line having a diameter of 12 μm.

The press member 202 was a flat plate spring having a thickness of 0.3 mm, and was made of SUS304CPS. The first and second wiring boards 79 and 87 and the anisotropic conductive member 89 were pressed by the press member 101 at the press force of 0.6 N per each electrode terminal.

In addition, for positioning of respective parts in the circuit board device, alignment marks not shown attached to the first and second wiring boards 87 and 89 and the anisotropic conductive member 89 were observed by a CCD camera such that the anisotropic conductive member 89 and the second wiring board 87 were positioned to the first wiring board 79. The positioning accuracy was ±50 μm.

The circuit board device according to the present invention produced using the anisotropic conductive member 89 comprising an insulating elastic resin material 103 whose hardness is sequentially changed and the comparative circuit board device produced using a general flat plate anisotropic conductive member were tested and evaluated by a four probe method. A DC contact electric resistance values were measured and averaged between the electrode terminals 73 and 81, the electrode terminals 75 and 83, and the electrode terminals 77 and 85, respectively. Between the electrode terminals 73 and 81, the resistance value was 0.75Ω in the inventive circuit, and was 15Ω in the comparative circuit. Between the electrode terminals 75 and 85, the resistance value was 0.47Ω in the inventive circuit, and was 1.8Ω in the comparative circuit. Between the electrode terminals 77 and 85, the resistance value was 0.35Ω in the inventive circuit, and was 0.35Ω in the comparative circuit.

The DC contact electric resistance values between the electrode terminals 73 and 81, 75 and 83, and 77 and 85 were within the range of 0.35 to 0.75Ω in the circuit board device using the anisotropic conductive member 89 comprising an insulating elastic resin material 103 whose hardness is sequentially changed according to the present invention. The DC contact electric resistance values between the electrode terminals 73 and 81, 75 and 83, and 77 and 85 were within the range of 0.35 to 15Ω in the comparative circuit board device using the flat plate anisotropic conductive member. It was found that by using the anisotropic conductive member 89 comprising an insulating elastic resin material whose hardness is sequentially changed corresponding to the step differences of the electrode terminals 73, 81, 75, 83, 77 and 85, a difference in a repulsion stress generated stepwise by pressurizing could be absorbed and its practical utility was confirmed.

In this regard, the first electrode terminals 73, 75 and 77 and the second electrode terminals 81, 83 and 85 are disposed in a matrix array of 10 rows×3 columns in this embodiment. However, the number is not limited thereto, any matrix array of n rows×m columns can provide the similar results.

Finally, an anisotropic conductive member 89 comprising a conductive material, i.e., metal terminal groups 91, 93 and 95 whose numbers per unit area are sequentially changed shown in FIG. 15 will be described. The anisotropic conductive member 89 is a flat plate having a thickness of 0.54 mm. The metal conductive terminals 91, 93 and 95 were made of an Au-plated SUS line having a diameter of 12 µm. The metal terminal groups 95 at the area E3 corresponding to the electrode terminals 77 and 85 have the numbers of 7/mm$^2$, the metal terminal groups 93 at the area E2 corresponding to the electrode terminals 75 and 83 have the numbers of 14/mm$^2$, the metal terminal groups 91 at the area E1 corresponding to the electrode terminals 73 and 81 have the numbers of 21/mm$^2$. The insulating elastic resin material 103 was made of a silicone rubber having a rubber hardness of 50 degree (JIS-K-6249).

The press member 101 was a flat plate spring having a thickness of 0.3 mm, and was made of SUS304CPS. The first and second wiring boards 79 and 87 and the anisotropic conductive member 89 were pressed by the press member 101 at the press force of 0.6 N per each electrode terminal.

In addition, for positioning of respective parts in the circuit board device, alignment marks not shown attached to the first and second wiring boards 87 and 89 and the anisotropic conductive member 89 were observed by a CCD camera such that the anisotropic conductive member 89 and the second wiring board 87 were positioned to the first wiring board 79. The positioning accuracy was ±50 µm.

The circuit board device according to the present invention produced using the anisotropic conductive member 89 comprising a conductive material, i.e., metal terminal groups 91, 93 and 95 whose numbers per unit area are sequentially changed and the comparative circuit board device produced using a general flat plate anisotropic conductive member were tested and evaluated by a four probe method. A DC contact electric resistance values were measured and averaged between the electrode terminals 73 and 81, the electrode terminals 75 and 85, and the electrode terminals 77 and 85, respectively. Between the electrode terminals 73 and 81, the resistance value was 0.35Ω in the inventive circuit, and was 15Ω in the comparative circuit. Between the electrode terminals 75 and 85, the resistance value was 0.37Ω in the inventive circuit, and was 1.8Ω in the comparative circuit. Between the electrode terminals 77 and 85, the resistance value was 0.29Ω in the inventive circuit, and was 0.35Ω in the comparative circuit.

The DC contact electric resistance values between the electrode terminals 73 and 81, 75 and 83, and 77 and 85 were within the range of 0.29 to 0.35Ω in the circuit board device using the anisotropic conductive member 89 comprising a conductive material whose numbers per unit area are changed according to the present invention. The DC contact electric resistance values between the electrode terminals 73 and 81, 75 and 83, and 77 and 85 were within the range of 0.35 to 15Ω in the comparative circuit board device using the flat plate anisotropic conductive member. It was found that by using the anisotropic conductive member 89 comprising a conductive material whose numbers per unit area are changed corresponding to the step differences of the electrode terminals 73, 81, 75, 83, 77 and 85, a difference in a repulsion stress generated stepwise by pressurizing could be absorbed and its practical utility was confirmed.

In this regard, the first electrode terminals 73, 75 and 77 and the second electrode terminals 81, 83 and 85 are disposed in a matrix array of 10 rows×3 columns in this embodiment. However, the number is not limited thereto, any matrix array of n rows×m columns can provide the similar results.

A combination of two or more of the above-described four types of the anisotropic conductive members 89 shown in FIGS. 12, 13, 14 and 15 can provide the similar results. Specifically, the four types of the anisotropic conductive members 89 are the anisotropic conductive member 89 having step differences disposed corresponding to the step differences of the electrode terminals 73, 75, 77, 81, 83 and 85 shown in FIG. 12, the anisotropic conductive member 89 having a taper in the lamination (thickness) direction corresponding to the step differences of the electrode terminals 73, 75, 77, 81, 83 and 85 shown in FIG. 13, the anisotropic conductive member 89 comprising an insulating elastic resin material whose hardness is sequentially changed corresponding to the step differences of the electrode terminals 73, 75, 77, 81, 83 and 85 shown in FIG. 14, and the anisotropic conductive member 89 comprising a conductive material, i.e., fine metallic wires whose numbers per unit area are sequentially changed corresponding to the step differences of the electrode terminals 73, 75, 77, 81, 83 and 85 shown in FIG. 15. For example, at least one of the anisotropic conductive member 89 comprising an insulating elastic resin material whose hardness is sequentially changed shown in FIG. 14 and the anisotropic conductive member 89 comprising a conductive material whose densities per unit area are sequentially changed shown in FIG. 15 may be combined with the anisotropic conductive member 89 having step differences shown in FIG. 12 or the anisotropic conductive member 89 having a taper shown in FIG. 13.

Figure 16:
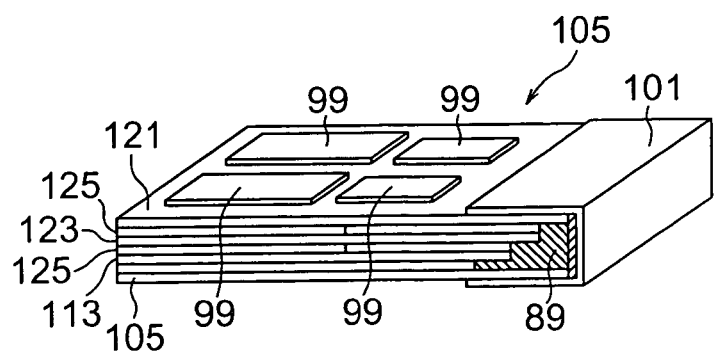
FIG. 16 is a whole perspective view showing a circuit board device according to a second embodiment of the present invention that can connect electrode terminals arranged in a matrix array on respective wiring boards.
Figure 17:
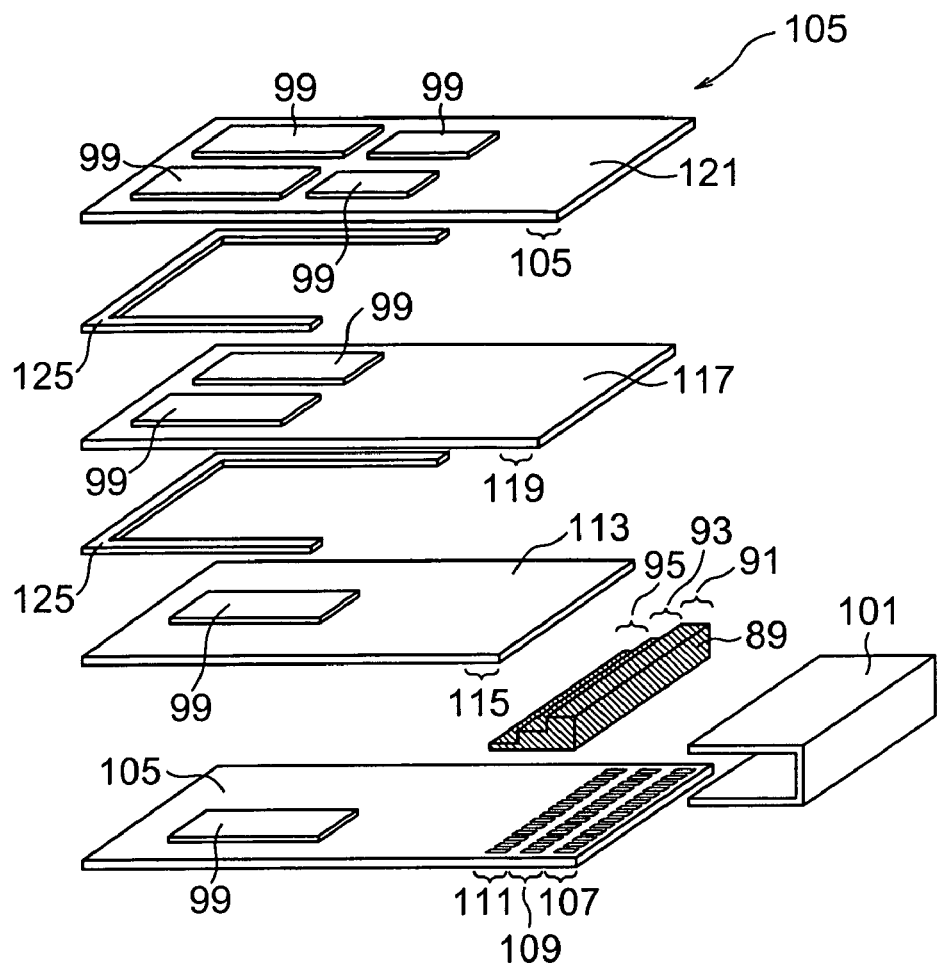
FIG. 17 is exploded view of a whole circuit wiring board shown in FIG. 16.
Figure 18:
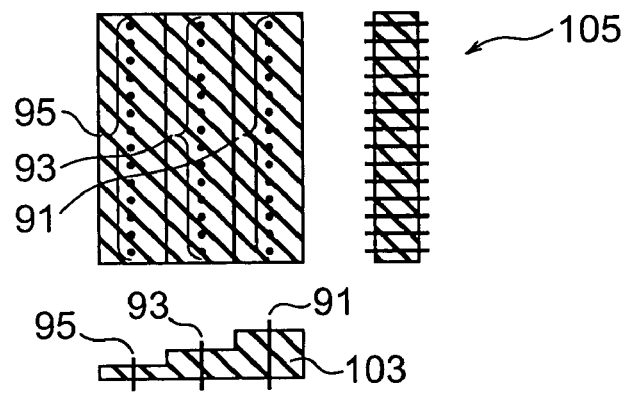
FIG. 18 is a three-view showing a detail of an anisotropic conductive member for use in the circuit board device shown in FIG. 16.

Referring to FIGS. 16, 17 and 18, the circuit board device and the anisotropic conductive member 89 according to the second embodiment of the present invention have different detail configuration from the above-described one.

Specifically, a first wiring board 105 is a rigid print wiring board having two layers (front and back) comprising FR4. First electrode terminals 107, 109 and 111 are flushed with the predetermined portion of the board by a subtractive process. The electrode terminals 107, 109 and 111 are disposed in a matrix array of 10 rows×3 columns without forming vias. One LSI 201 is surface-mounted on the same layer of the electrode terminals 107, 109 and 111 to assure electrical conductivity. The first wiring board 105 has a thickness of 0.3 mm. The electrode terminals 107, 109 and 111 on the first wiring board 105 has 10 terminals, a pitch of 0.6 mm (L/S=0.1/0.5 mm), a terminal size of 0.3 (W)×0.3 (L) mm.

A second wiring board 113 is a rigid print wiring board having two layers (front and back) comprising FR4 similar to the first wiring board 105. Electrode terminals 115 are formed in 10 rows×1 column at the predetermined portion of the board by a subtractive process without forming vias. One LSI 199 having a thickness of 1 mm is surface-mounted on the back layer of the electrode terminals 115 to assure electrical conductivity with the electrode terminals 115 through vias or wiring circuits not shown. The second wiring board 113 has a thickness of 0.3 mm. The electrode terminals 115 on the second wiring board 113 has 10 terminals, a pitch of 0.6 mm (L/S=0.1/0.5 mm), a terminal size of 0.3 (W)×0.3 (L) mm.

A third wiring board 117 is a rigid print wiring board having two layers (front and back) comprising FR4 similar to the first wiring board 105. Electrode terminals 119 are formed in 10 rows×1 column at the predetermined portion of the board by a subtractive process without forming vias. Two LSIs 99 each having a thickness of 1 mm are surface-mounted on the back layer of the electrode terminals 119 to assure electrical conductivity with the electrode terminals 119 through vias or wiring circuits not shown. The third wiring board 105 has a thickness of 0.3 mm. The electrode terminals 119 on the third wiring board 105 has 10 terminals, a pitch of 0.6 mm (L/S=0.1/0.5 mm), a terminal size of 0.3 (W)×0.3 (L) mm.

A fourth wiring board 121 is a rigid print wiring board having two layers (front and back) comprising FR4 similar to the first wiring board 105. Electrode terminals 105, 119 and 115 are formed in 10 rows×1 column at the predetermined portion of the board by a subtractive process without forming vias. Four LSI 199 each having a thickness of 1 mm are surface-mounted on the back layer of the electrode terminals 105 to assure electrical conductivity with the electrode terminals 105 through vias or wiring circuits not shown. The fourth wiring board 121 has a thickness of 0.3 mm. The electrode terminals 105 on the fourth wiring board 121 has 10 terminals, a pitch of 0.6 mm (L/S=0.1/0.5 mm), a terminal size of 0.3 (W)×0.3 (L) mm.

The second, third and fourth wiring boards 113,117 and 121 are disposed facing to the first wiring board 105 so that the electrode terminals 107, 119 and 115 are faced to the first electrodes 107, 109 and 110, respectively. Plural metal terminal groups 91, 93 and 95 are embedded at the positions corresponding to the electrode terminals 107,109, 111, 105 and 115 of the first, second, third and fourth wiring boards 105, 113,117 and 121 so that both ends of the metal terminal groups are exposed. An anisotropic conductive member 89 having step differences in one lamination (thickness) direction (at the second, third and fourth wiring boards 113,117 and 121) is sandwiched between the first wiring boards 105 and the second, third and fourth wiring boards 113, 117 and 121 via a spacer 125 to provide a laminate. The laminate is pressed by a press member 101 in the lamination (up-and-down, thickness) direction to electrically connect. Thus, the circuit board device according to the second embodiment is provided as shown in FIG. 16.

As compared with the technical principle described referring to FIGS. 7, 8 and 9, in this circuit board device, the electrode terminals 105,119 and 115 regard as the second electrode terminals, and the second, third and fourth wiring boards 113, 117 and 121 regard as the second wiring board. By inserting the spacers 125 as contact prevention means between the second and third wiring boards 113 and 117 and between the third and fourth wiring boards 117 and 121, the LSIs 99 surface-mounted on the second and third wiring boards 113 and 117 are prevented from contacting with the surfaces of the boards disposed above. The spacer 125 is preferably used for preventing the contact between adjacent wiring boards depending on the circuit configuration, and electronic parts mounted on the adjacent wiring boards. In either case, the spacer 125 has a thickness of 1.1 mm, and made of an ABS resin.

In the anisotropic conductive member 117, the insulating elastic resin material 103 was made of a silicone rubber having a rubber hardness of 50 degree (JIS-K-6249), and the metal conductive terminals 91, 93 and 95 were made of an Au-plated SUS line having a diameter of 12 μm. The thinnest part of the anisotropic conductive member 89 had a thickness of 0.3 mm. The first step difference has a thickness of 1.5 mm by adding the thicknesses of the spacer 125 and the third wiring board 89 and subtracting compression of the anisotropic conductive member 89 by the press member 101, and the second step difference has a thickness of 1.5 mm by adding the thicknesses of the spacer 125 and the fourth wiring board 121 and subtracting compression of the anisotropic conductive member 117 by the press member 101, similar to the first step difference. The step difference corresponding to the electrode terminals 111 and 115 had a thickness of 0.3 mm, the step difference corresponding to the electrode terminals 109 and 119 had a thickness of 1.8 mm, and the step difference corresponding to the electrode terminals 107 and 105 had a thickness of 3.3 mm.

The press member 101 was a flat plate spring having a thickness of 0.3 mm, and was made of SUS304CPS. The first, second, third and fourth wiring boards 105, 113, 117 and 121 and the anisotropic conductive member 89 were pressed at the press force of 0.6 N per each electrode terminal.

In addition, for positioning of respective parts in the circuit board device, alignment marks not shown attached to the first, second, third and fourth wiring boards 105, 113, 117 and 121 and the anisotropic conductive member 89 were observed by a CCD camera such that the anisotropic conductive member 89 and the second, third and fourth wiring boards 113, 117 and 121 were positioned to the first wiring board 105. The positioning accuracy was ±50 μm.

It was confirmed that all 30 terminals in the circuit board device showed excellent electrical conductivity.

In this regard, the first electrode terminals 107, 109, 111 and the second electrode terminals 105, 119 and 115 are disposed in a matrix array of 10 rows×3 columns in this embodiment. However, the number is not limited thereto, any matrix array of n rows×m columns can provide the similar results. A combination of two or more of the above-described four types of the anisotropic conductive members 89 can provide the similar results. Specifically, the four types of the anisotropic conductive members 89 are the anisotropic conductive member 89 having step differences disposed in one lamination (thickness) direction corresponding to the step differences of the electrode terminals 105, 119 and 115, the anisotropic conductive member 89 having a taper in one lamination (thickness) direction corresponding to the step differences of the electrode terminals 105, 119 and 115, the anisotropic conductive member 89 comprising an insulating elastic resin material whose hardness is sequentially changed corresponding to the step differences of the electrode terminals 105, 119 and 115, and the anisotropic conductive member 89 comprising a conductive material, i.e., fine metallic wires whose numbers per unit area are sequentially changed corresponding to the step differences of the electrode terminals 105, 119 and 115.

Figure 19:
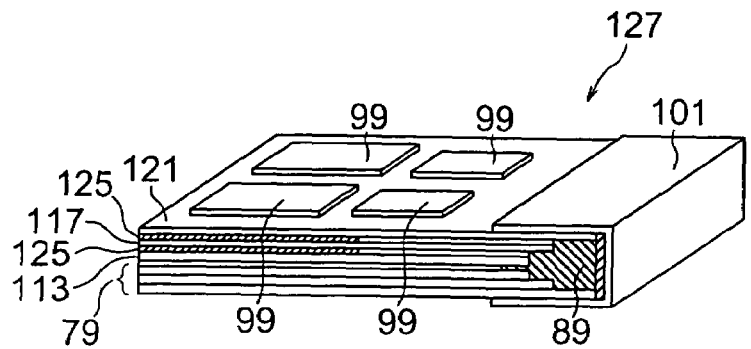
FIG. 19 is a whole perspective view showing a circuit board device according to a third embodiment of the present invention that can connect electrode terminals arranged in a matrix array on respective wiring boards.
Figure 20:
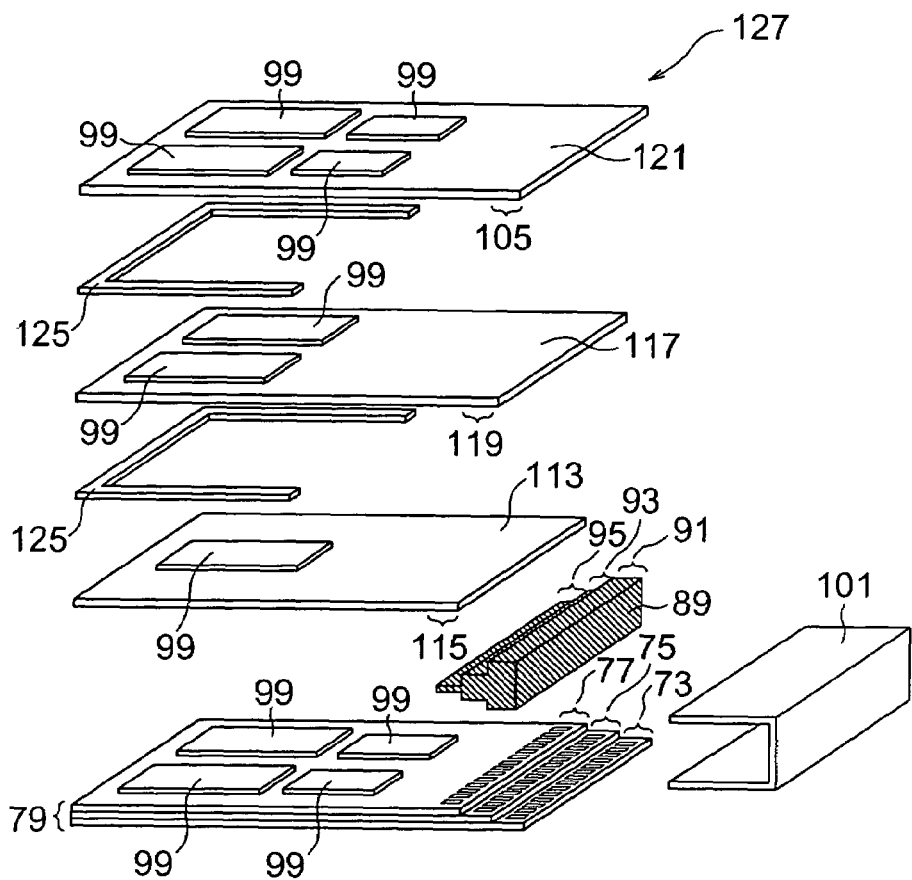
FIG. 20 is an exploded view of a whole circuit wiring board shown in FIG. 19.
Figure 21:
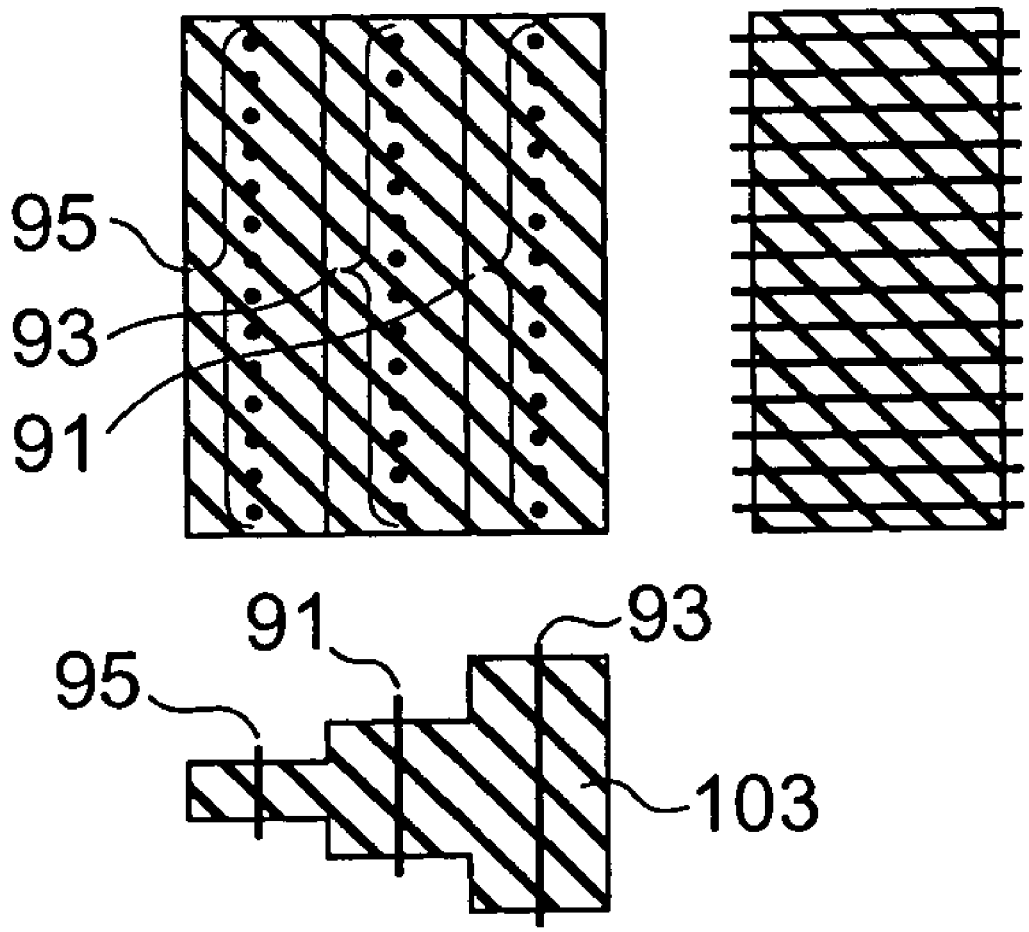
FIG. 21 is a three-view showing a detail of an anisotropic conductive member for use in the circuit board device shown in FIG. 19.

Referring to FIGS. 19, 20 and 21, according to the third embodiment of the present invention, the circuit board device according to the second embodiment is changed so that the first wiring board 79 has step differences at a local portion, and the first electrode terminals 73, 75 and 77 are formed on the steps.

Specifically, a first wiring board 79 is a rigid print wiring board having four layers (four wiring layers are formed on three boards shown in the figures) comprising FR4. First electrode terminals 73, 75 and 77 are disposed on respective steps by a build-up process. Three wiring circuits are formed on the electrode terminals 73, 75 and 77 without forming the vias. The first electrode terminals 73, 75 and 77 are disposed in a matrix array of 10 rows×3 columns. Wirings of the electrode terminals 73 and 75 are drawn to the same layer of the electrode terminal 77 through vias disposed on an area not shown other than the electrode terminals. Four LSIs 99 are surface-mounted on the same layer of the electrode terminal 77. Through the vias or the wiring circuits, the first electrode terminals 73, 75 and 77 are electrically conducted. The first electrode terminals 83, 75 and 77 on the first wiring board 79 has 10 terminals, a pitch of 0.2 mm (L/S=0.1/0.1 mm), a terminal size of 0.1 (W)×0.3 (L) mm. The step difference between the terminals is 60 μm.

A second wiring board 113 is a rigid print wiring board having two layers (front and back) comprising FR4. Electrode terminals 115 are formed in 10 rows×1 column at the predetermined portion of the board by a subtractive process without forming vias. One LSI 199 having a thickness of 1 mm is surface-mounted on the back layer of the electrode terminals 115 to assure electrical conductivity with the electrode terminals 115 through vias or wiring circuits not shown. The second wiring board 113 has a thickness of 0.3 mm. The electrode terminals 115 on the second wiring board 113 has 10 terminals, a pitch of 0.6 mm (L/S=0.1/0.5 mm), a terminal size of 0.3 (W)×0.3 (L) mm.

A third wiring board 117 is a rigid print wiring board having two layers (front and back) comprising FR4 similar to the second wiring board 113. Electrode terminals 119 are formed in 10 rows×1 column at the predetermined portion of the board by a subtractive process without forming vias. Two LSIs 99 each having a thickness of 1 mm are surface-mounted on the back layer of the electrode terminals 119 to assure electrical conductivity with the electrode terminals 119 through vias or wiring circuits not shown. The third wiring board 117 has a thickness of 0.3 mm. The electrode terminals 119 on the third wiring board 117 has 10 terminals, a pitch of 0.2 mm (L/S=0.1/0.1 mm), a terminal size of 0.1 (W)×0.3 (L) mm.

A fourth wiring board 121 is a rigid print wiring board having two layers (front and back) comprising FR4 similar to the second wiring board 113. Electrode terminals 105 are formed in 10 rows×1 column at the predetermined portion of the board by a subtractive process without forming vias. Four LSIs 99 each having a thickness of 1 mm are surface-mounted on the back layer of the electrode terminals 105, 119 and 115 to assure electrical conductivity with the electrode terminals 105 through vias or wiring circuits not shown. The fourth wiring board 121 has a thickness of 0.3 mm. The electrode terminals 105 on the fourth wiring board 121 has 10 terminals, a pitch of 0.2 mm (L/S=0.1/0.1 mm), a terminal size of 0.1 (W)×0.3 (L) mm.

The second, third and fourth wiring boards 113, 117 and 121 are disposed facing to the first wiring board 79 so that the electrode terminals 105, 119 and 115 are faced to the first electrodes 73, 75 and 77, respectively. Plural metal terminal groups 91, 93 and 95 are embedded at the positions corresponding to the electrode terminals 73, 75, 77, 105, 119 and 115 of the first, second, third and fourth wiring boards 79, 113, 117 and 121 so that both ends of the metal terminal groups are exposed. An anisotropic conductive member 89 having step differences in both lamination (thickness) directions is sandwiched between the first wiring boards 79 and the second, third and fourth wiring boards 113, 117 and 121 via a spacer 125 to provide a laminate. The laminate is pressed by a press member 101 in the lamination (up-and-down, thickness) direction to electrically connect. Thus, the circuit board device according to the third embodiment is provided as shown in FIG. 19.

As compared with the technical principle described referring to FIGS. 7, 8 and 9, in this circuit board device, the electrode terminals 105, 119 and 115 regard as the second electrode terminals, and the second, third and fourth wiring boards 113, 117 and 121 regard as the second wiring board. By inserting the spacers 125 as contact prevention means between the second and third wiring boards 113 and 117 and between the third and fourth wiring boards 117 and 121, the LSIs 99 surface-mounted on the second and third wiring boards 113 and 117 are prevented from contacting with the surfaces of the boards disposed above. The spacer 125 is preferably used for preventing the contact between adjacent wiring boards depending on the circuit configuration, and electronic parts mounted on the adjacent wiring boards. In either case, the spacer 125 has a thickness of 1.1 mm, and made of an ABS resin.

In the anisotropic conductive member 89, the insulating elastic resin material 103 was made of a silicone rubber having a rubber hardness of 50 degree (JIS-K-6249), and the metal conductive terminals 91, 93 and 95 were made of an Au-plated SUS line having a diameter of 12 μm. The thinnest part of the anisotropic conductive member 89 had a thickness of 0.3 mm. The first step difference has a thickness of 1.56 mm by adding the thicknesses of the steps each having 60 μm of the first wiring board 79, the spacer 125 and the second wiring board 113 and subtracting compression of the anisotropic conductive member 89 by the press member 101, and the second step difference has a thickness of 1.56 mm by adding the thicknesses of the steps each having 60 μm of the first wiring board 79, the spacer 125 and the third wiring board 117 and subtracting compression of the anisotropic conductive member 89 by the press member 101, similar to the first step difference. The step difference corresponding to the electrode terminals 77 and 115 had a thickness of 0.3 mm, the step difference corresponding to the electrode terminals 75 and 115 had a thickness of 1.86 mm, and the step difference corresponding to the electrode terminals 73 and 105 had a thickness of 3.42 mm.

The press member 101 was a flat plate spring having a thickness of 0.3 mm, and was made of SUS304CPS. The first, second, third and fourth wiring boards 79, 113, 117 and 121 and the anisotropic conductive member 89 were pressed at the press force of 0.6 N per each electrode terminal.

In addition, for positioning of respective parts in the circuit board device, alignment marks not shown attached to the first, second, third and fourth wiring boards 79, 113, 117 and 121 and the anisotropic conductive member 89 were observed by a CCD camera such that the anisotropic conductive member 89 and the second, third and fourth wiring boards 113, 117 and 121 were positioned to the first wiring board 105. The positioning accuracy was ±50 μm.

It was confirmed that all 30 terminals in the circuit board device showed excellent electrical conductivity.

In this regard, the first electrode terminals 73, 75 and 77 and the second electrode terminals 105, 119 and 115 are disposed in a matrix array of 10 rows×3 columns in this embodiment. However, the number is not limited thereto, any matrix array of n rows×m columns can provide the similar results. A combination of two or more of the above-described four types of the anisotropic conductive members 89 can provide the similar results. Specifically, the four types of the anisotropic conductive members 89 are the anisotropic conductive member 89 having step differences disposed in both lamination (thickness) directions corresponding to the step differences of the electrode terminals 73, 75, 77, 105, 119 and 115, the anisotropic conductive member 89 having a taper in both lamination (thickness) directions corresponding to the step differences of the electrode terminals 73, 75, 77, 105, 119 and 115, the anisotropic conductive member 89 comprising an insulating elastic resin material whose hardness is sequentially changed corresponding to the step differences of the electrode terminals 73, 75, 77, 105, 119 and 115, and the anisotropic conductive member 89 comprising a conductive material, i.e., fine metallic wires whose numbers per unit area are sequentially changed corresponding to the step differences of the electrode terminals 73, 75, 77, 105, 119 and 115.

Figure 22:
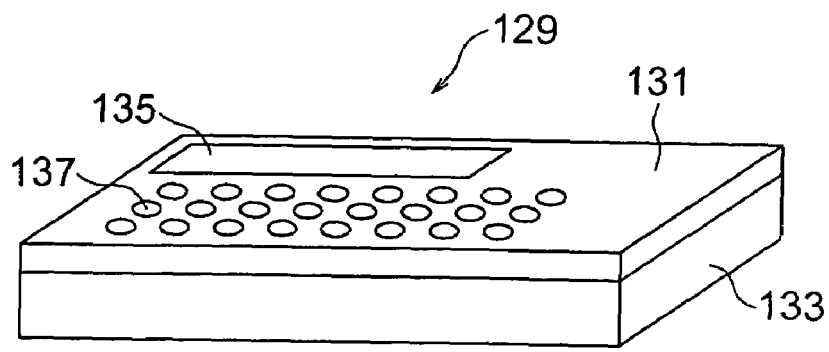
FIG. 22 is a whole perspective view of a simple display console device including the circuit board device within an upper housing and a lower housing that are substituted with a press member according to the first embodiment of the present invention.
Figure 23:
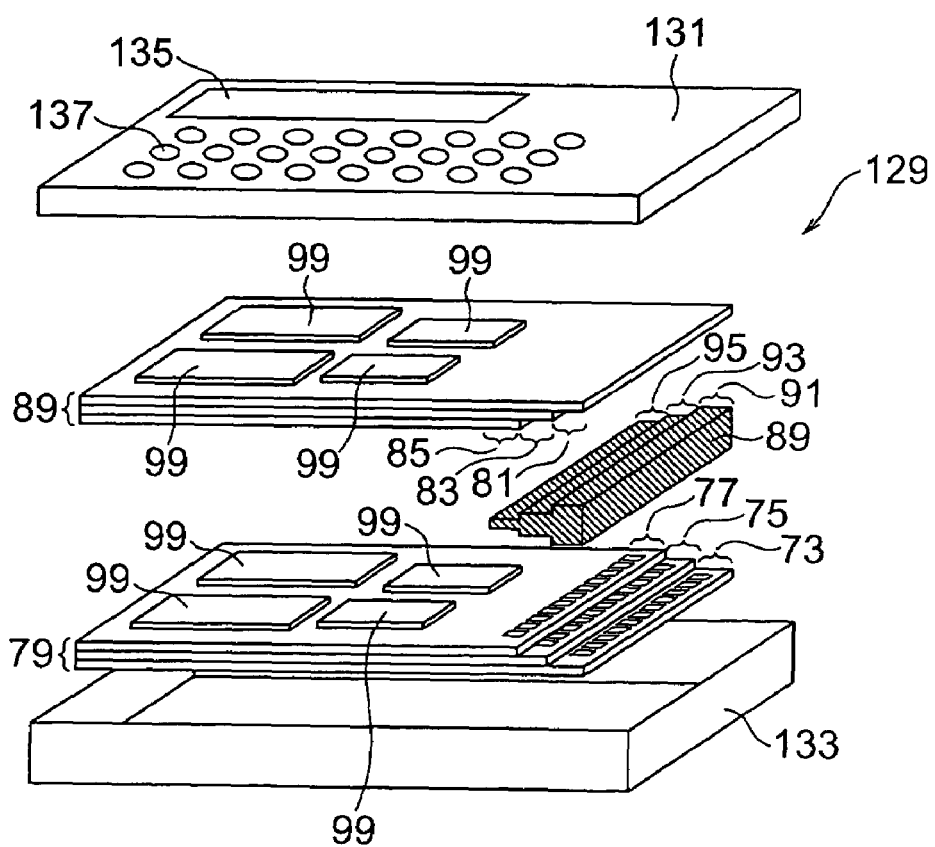
FIG. 23 is a whole exploded perspective view of the circuit board device shown in FIG. 22.

FIGS. 22 and 23 show a simple display console device including the circuit board device according to the third embodiment within an upper housing 131 and a lower housing 133 that are substituted with the press member 101 according to the first embodiment shown in FIGS. 10, 11 and 12. The circuit board device according to the first embodiment shown in FIGS. 10, 11 and 12 is not pressed and held by the press member 101, but is housed within the upper housing 131 on which a display 135 and input switches 137 are formed and the lower housing 133. The upper housing 131 and the lower housing 133 are fit, pressed and held to electrically connect the first wiring board 79 and the second wiring board 89 where the anisotropic conductive member 89 is sandwiched therebetween, thereby providing the simple display console device.

In the simple display console device, when the first wiring board 79 are electrically connected to the second wiring board 87 where the anisotropic conductive member 89 is sandwiched therebetween via a flexible print wiring board no shown upon the fitting, the display 135 of the upper housing 131 displays images, characters and the like. The images, characters and the like displayed can be turned on/off or switched by the input switch 137.

As described above, according to the circuit board device of the present invention comprises a first wiring board having plural first electrode terminals for connection row-arranged on a surface layer, a second wiring board having plural second electrode terminals for connection row-arranged on a surface layer, and an anisotropic conductive member disposed between the first wiring board and the second wiring board to connect the first electrode terminals and to connect the second electrode terminals. The local portion of at least either of the first wiring board and the second wiring board has a step difference to divide and dispose at least either of the first electrode terminals and the second electrode terminals. The local portion of the anisotropic conductive member corresponding to the step difference has a step shape that is capable of contacting with the step difference. The laminate comprising respective wiring boards and the anisotropic conductive member disposed therebetween is pressed and held in a lamination direction. Through the method of interconnecting the wiring board of the present invention, the first electrode terminals of the first wiring board are electrically connected via the anisotropic conductive member and the second electrode terminals of the second wiring board are electrically connected via the anisotropic conductive member. According to the circuit board device and the method of interconnecting the wiring boards of the present invention, various advantages are provided. The circuit board device comprising the removable wiring boards on which the plural electrode (signal) terminals for connection are disposed in a matrix array can be produced easier than the conventional configuration including the vias or the connectors, thereby realizing slimming and space-saving. It is also possible to prevent a poor contact caused by the dented vias upon the use of the anisotropic conductive member and a poor electrical connection caused by warping of the board. In addition, since the electrode terminals of each wiring board are adhered using no connecting medium, each wiring board would not be damaged. Even if the defective part is produced, the wiring board can be removed easily. The anisotropic conductive member to be pressed comprises an insulating elastic resin material. When both ends of the metal terminal groups embedded as the conductive portion are connected to respective electrode terminals disposed on the step differences of the wiring boards by pressing and holding, contact pressure variations can be prevented, and the metal terminal groups are stably connected to the respective electrode terminals on the step differences, thereby preventing the poor connection.

The invention claimed is:

1. A circuit board device, comprising:
a first wiring board having a first plurality of electrode terminals arranged in a row on a first layer, and a second plurality of electrode terminals arranged in a row on a second layer, wherein a step difference exists between the first and second layers;
a second wiring board having a third plurality of electrode terminals arranged in a row on a third layer and a fourth plurality of electrode terminals arranged in a row on a fourth layer, wherein a step difference exists between the third and fourth layers; and
an anisotropic conductive member disposed between the first wiring board and the second wiring board to connect at least one of the electrode terminals of the first wiring board at least one of the electrode terminals of the second wiring board,
wherein the anisotropic conductive member has step differences corresponding to the step differences in the first and second wiring boards, and
wherein the first wiring board, the second wiring board, and the anisotropic conductive member disposed therebetween constitute a laminate pressed and held in a lamination direction.

2. The circuit board device according to claim 1, wherein at least one of the plurality of electrode terminals is disposed in a matrix array on the step difference of at least one of the first wiring board and the second wiring board without forming vias.

3. The circuit board device according to claim 1, wherein at least one of the first wiring board and the second wiring board having the step difference is a laminate structure, wherein wiring surfaces are laminated on the surface layer so that at least one of the plurality of electrode terminals disposed on the step difference is divided, and the wiring surfaces are drawn across a plurality of different layers.

4. The circuit board device according to claim 1, wherein the anisotropic conductive member has a conductive portion and an insulating portion that are integrally formed, wherein the conductive portion extends in the lamination direction between the first wiring board and the second wiring board and has exposed ends, and wherein the insulating portion occupies a large part excluding the both ends of the conductive portion.

5. The circuit board device according to claim 1, wherein a corresponding position to the step difference at a local portion of the anisotropic conductive member is sandwiched between the first wiring board and the second wiring board in the lamination direction, and wherein the step differences in the anisotropic conductive member are tightly contacted with the step difference of the tapered step in a direction from one end to a center of at least one of the first wiring board and the second wiring board.

6. The circuit board device according to claim 1, wherein a corresponding position to the step difference at a local portion of the anisotropic conductive member is sandwiched between the first wiring board and the second wiring board in the lamination direction, and wherein the anisotropic conductive member has a taper that is tightly contacted with the step difference of the tapered tilt in a direction from one end to a center of at least either the first wiring board and the second wiring board.

7. The circuit board device according to claim 1, wherein at a local portion of the anisotropic conductive member comprises the insulating material whose hardness is changed from one end to the center of at least one of the first wiring board and the second wiring board.

8. The circuit board device according to claim 1, wherein at a local portion of the anisotropic conductive member comprises the conductive material whose density per unit area is changed from one end to the center of at least either of the first wiring board and the second wiring board.

9. The circuit board device according to claim 1, wherein at a local portion of the anisotropic conductive member comprises the insulating material whose hardness is changed from one end to the center of at least either of the first wiring board and the second wiring board, and wherein a local portion of the anisotropic conductive member comprises the conductive material whose density per unit area is changed from one end to the center of at least either of the first wiring board and the second wiring board.

10. The circuit board device according to claim 1, wherein each of the first wiring board and the second wiring board uses one or more of a multilayer flexible circuit board, a multilayer rigid print circuit board, a double face flexible circuit board and a double face rigid print circuit board.

11. The circuit board device according to claim 1, further comprising contact prevention means for preventing a contact between adjacent portions of the first wiring board and the second wiring board, between one electronic part and the other electronic part mounted one of the first wiring board and the second wiring board, and between electronic parts mounted on the first wiring board and the second wiring board.

12. The circuit board device according to claim 1, further comprising a press member for pressing the laminate in the lamination direction.

13. The circuit board device according to claim 4, wherein a conductive material of the conductive portion uses a fine metallic wire made from one of gold, copper, brass, phosphor bronze, nickel, and stainless steel, and wherein an insulating material of the insulating portion uses an insulating elastic resin material.

14. The circuit board device according to claim 4, wherein a conductive material of the conductive portion uses one of metal particles, gold plated articles, silver plated particles, copper plated particles, carbon particles and metal plated rein particles, and wherein an insulating material of the insulating portion is an insulating elastic resin material.

15. The circuit board device according to claim 7, wherein the insulating material has a hardness that is changed from one end to the center of at least either of the first wiring board and the second wiring board.

16. The circuit board device according to claim 8, wherein the conductive material has a density per unit area is changed from one end to the center of the at least one of the first wiring board and the second wiring board.

17. The circuit board device according to claim 12, wherein the press member is a housing having fitting force that can be mounted to the laminate.

18. The circuit board device according to claim 12, wherein the press member is a plate spring having a substantially C-shaped or U-shaped section with elastic recovery force that can be mounted to the laminate.

* * * * *